US005874840A

United States Patent [19]
Bonaccio

[11] Patent Number: 5,874,840
[45] Date of Patent: *Feb. 23, 1999

[54] DIFFERENTIAL SOURCE FOLLOWER WITH BODY EFFECT COMPENSATION

[75] Inventor: Anthony R. Bonaccio, Shelburne, Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 639,868

[22] Filed: Apr. 26, 1996

[51] Int. Cl.$^6$ ....................................................... H03K 5/24
[52] U.S. Cl. .............................. 327/55; 327/51; 327/52; 327/65; 330/253
[58] Field of Search ................................. 327/51, 52, 54, 327/55, 57, 65, 560, 561, 562, 563; 330/252, 253

[56] References Cited

U.S. PATENT DOCUMENTS

| | | | |
|---|---|---|---|
| 3,848,139 | 11/1974 | Holt, Jr. | 307/235 R |
| 4,124,808 | 11/1978 | Shieu et al. | 307/362 |
| 4,170,741 | 10/1979 | Williams | 307/355 |
| 4,586,166 | 4/1986 | Shah | 365/154 |
| 4,602,167 | 7/1986 | Yukawa | 307/355 |
| 4,658,160 | 4/1987 | Young | 307/530 |
| 4,785,206 | 11/1988 | Hoshi | 307/530 |
| 4,845,675 | 7/1989 | Krenik et al. | 365/203 |
| 4,871,933 | 10/1989 | Galbraith | 307/530 |
| 5,097,157 | 3/1992 | Jaffe et al. | 307/530 |
| 5,113,147 | 5/1992 | Klein | 330/253 |
| 5,241,504 | 8/1993 | Seevinck | 365/205 |
| 5,274,275 | 12/1993 | Colles | 307/362 |
| 5,345,121 | 9/1994 | Itoh | 307/530 |

Primary Examiner—Timothy P. Callahan
Assistant Examiner—An T. Luu
Attorney, Agent, or Firm—Eugene I. Shkurko

[57] ABSTRACT

An improved differential source follower with negligible input/output mismatch over a wide range of input signal magnitudes. A pair of FETs and current sources provides bias current control for each differential output that cancels the inherent body-source voltage variation of the source followers which acts to attenuate the unity gain output signal.

16 Claims, 5 Drawing Sheets

DIFFERENTIAL SOURCE FOLLOWER WITH BODY EFFECT COMPENSATION

BACKGROUND OF THE INVENTION

1. Technical Field of the Invention

This invention generally pertains to analog signal processing circuits. In particular, this invention is directed to an improved input buffer circuit providing improved performance over a wider range of input signal levels.

2. Background Art

Analog signal processing circuits often require unity gain buffers at their inputs to minimize loading on the circuit which drives them. A method of implementing such a buffer is to use a single device unity-gain amplifier such as a source follower or common drain transistor. In such a configuration, the source is typically biased with a DC current of 10 to 100 $\mu A$, the input signal is applied to the gate, and the output appears at the source, shifted by a voltage equal to the $V_{GS}$ of the device at the given bias level.

A problem occurs with this circuit because the shift voltage $V_{GS}$ is a function of the threshold voltage of the device. Since the device threshold is a function of its source-body voltage (i.e., is affected by the input signal), and the source voltage is the output signal, the level shift from input to output becomes a function of the input signal. Thus, this problem is inherent in the FET source-body structure and causes an attenuation of the output signal because $V_{GS}$ is proportional to the input signal, as shown in FIG. 1B (not drawn to scale). Ideally, the biasing means should compensate for the source-body voltage fluctuation and maintain $V_{GS}$ at a constant (DC) level without the variation seen in FIG. 1B.

Many analog circuits that use such conventional followers are differential circuits implemented to reject common-mode noise. In such a case the effect described above is doubled because the thresholds change in opposite directions. A typical differential source follower is illustrated in FIG. 1 and its transfer function shown in FIG. 2. Note the difference between the input signal voltage and the output signal voltage for signal magnitudes greater than about ±200 mV, which mismatch by about 5% in the ±500 mV range. For circuits that process the absolute amplitude of the input signal, such as peak detectors, this margin of error can be a significant drawback.

It is an object of the invention to provide a differential source follower with no body effect induced errors.

It is another object of the invention to provide an analog input buffer providing accurate performance over a wide range of input signal levels.

It is yet another object of the invention to provide a differential source follower with a low power mode.

SUMMARY OF THE INVENTION

As mentioned under Background Art, when an input signal is applied to the input gate of the differential source follower, the full input signal does not appear at the output because the voltage shift from gate to source is itself influenced by the input signal voltage, due to the inherent body effect described above. This results in an attenuation of the input signal from the gate to the source, and appears as a weakened output signal. However, it is essential to note that the voltage shift from gate to source ($V_{GS}$) is a function of the drain current ($I_1$ of FIG. 1A), heretofore assumed to be maintained constant by the current source.

Therefore, one preferred embodiment of the present invention comprises a method of modulating the drain current to cause a change in the gate to source voltage that exactly counteracts the source voltage swing caused by the body effect, thus, reducing or eliminating the overall attenuation.

The present invention achieves this goal by implementing a differential source follower biased by a pair of cross-coupled transistors of the same type as the followers. The sizes of the cross-coupled pair are selected to precisely cancel out the body effect in the followers. The circuit level-shifts both phases of the differential signal while not affecting the differential voltage.

Therefore, a second preferred embodiment of the present invention comprises an apparatus coupled to a voltage supply having inputs for receiving differential input signals, and providing unity gain output signals, in response to the differential input signals, having a much improved input-to-output mismatch. The improved unity gain is provided by a pair of FETs and current sources coupled to the outputs which counteract the inherent voltage fluctuation in the output FETs which attenuate the output signals. One of the outputs provides a modulation signal for an FET-current source pair controlling a bias current through the other output.

A third preferred embodiment comprises a differential source follower that counteracts the attenuation of its output signals and which also includes a low power control circuit for turning off bias currents flowing through the source followers in order to reduce power consumption.

Other features and advantages of this invention will become apparent from the following detailed description of the presently preferred embodiment of the invention, taken in conjunction with the accompanying drawings.

BEST MODE FOR CARRYING OUT THE INVENTION

Figure 1A:
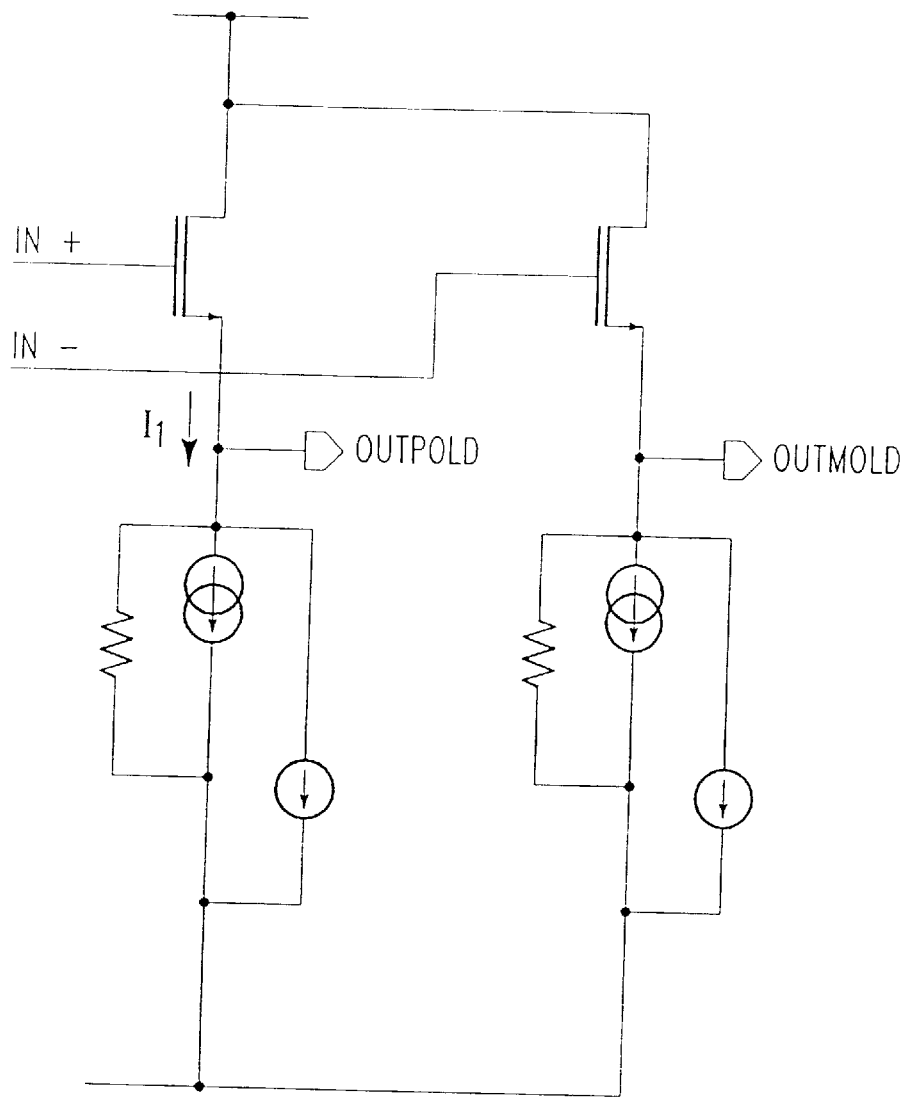
FIG. 1A illustrates a conventional differential source follower.
Figure 1B:
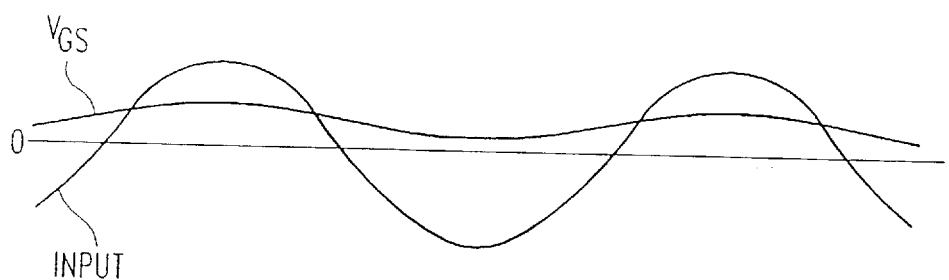
FIG. 1B (not drawn to scale) illustrates a typical $V_{GS}$ fluctuation in conventional differential source followers.
Figure 2:
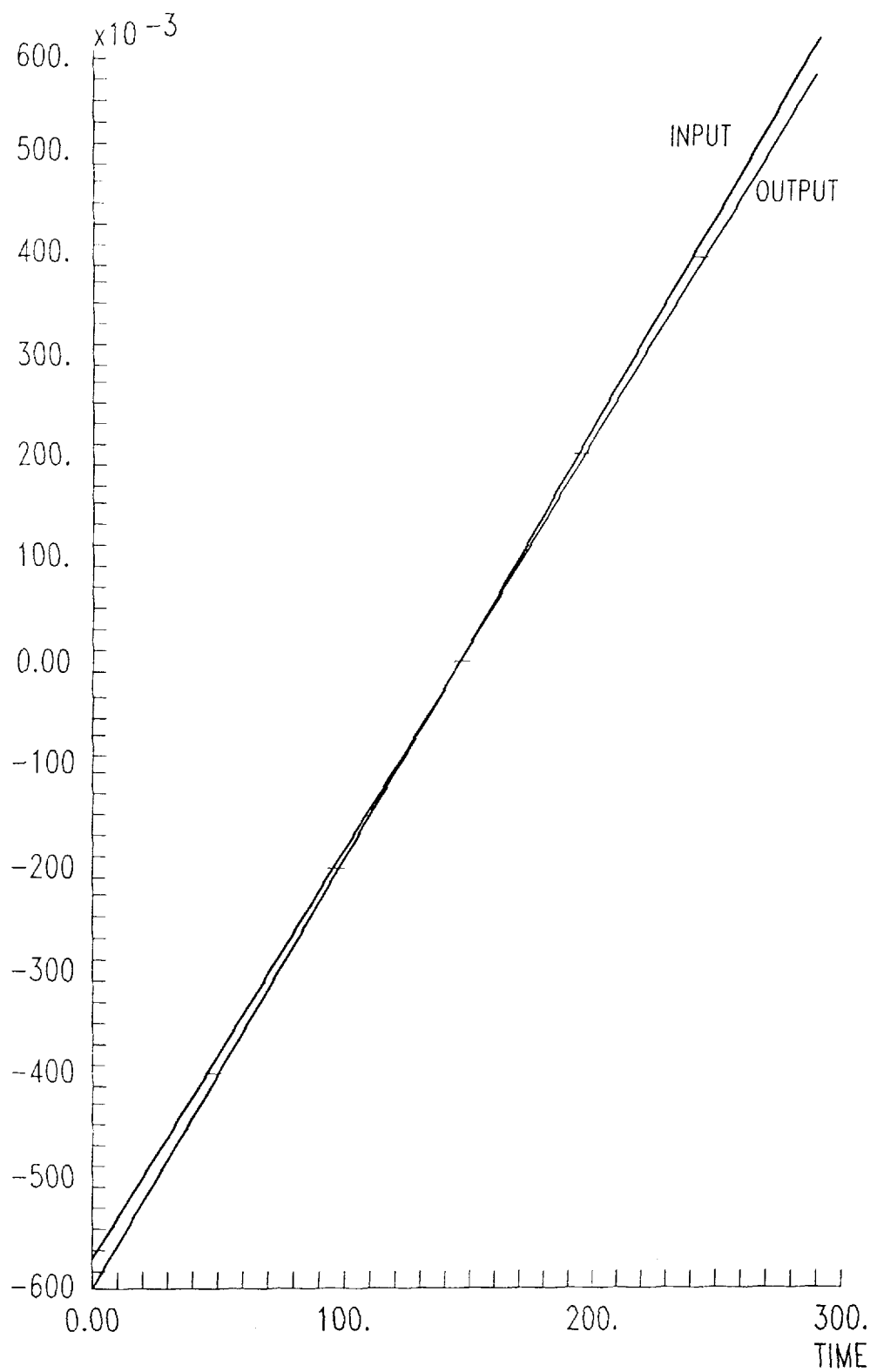
FIG. 2 illustrates the transfer function for the differential source follower of FIG. 1.
Figure 3:
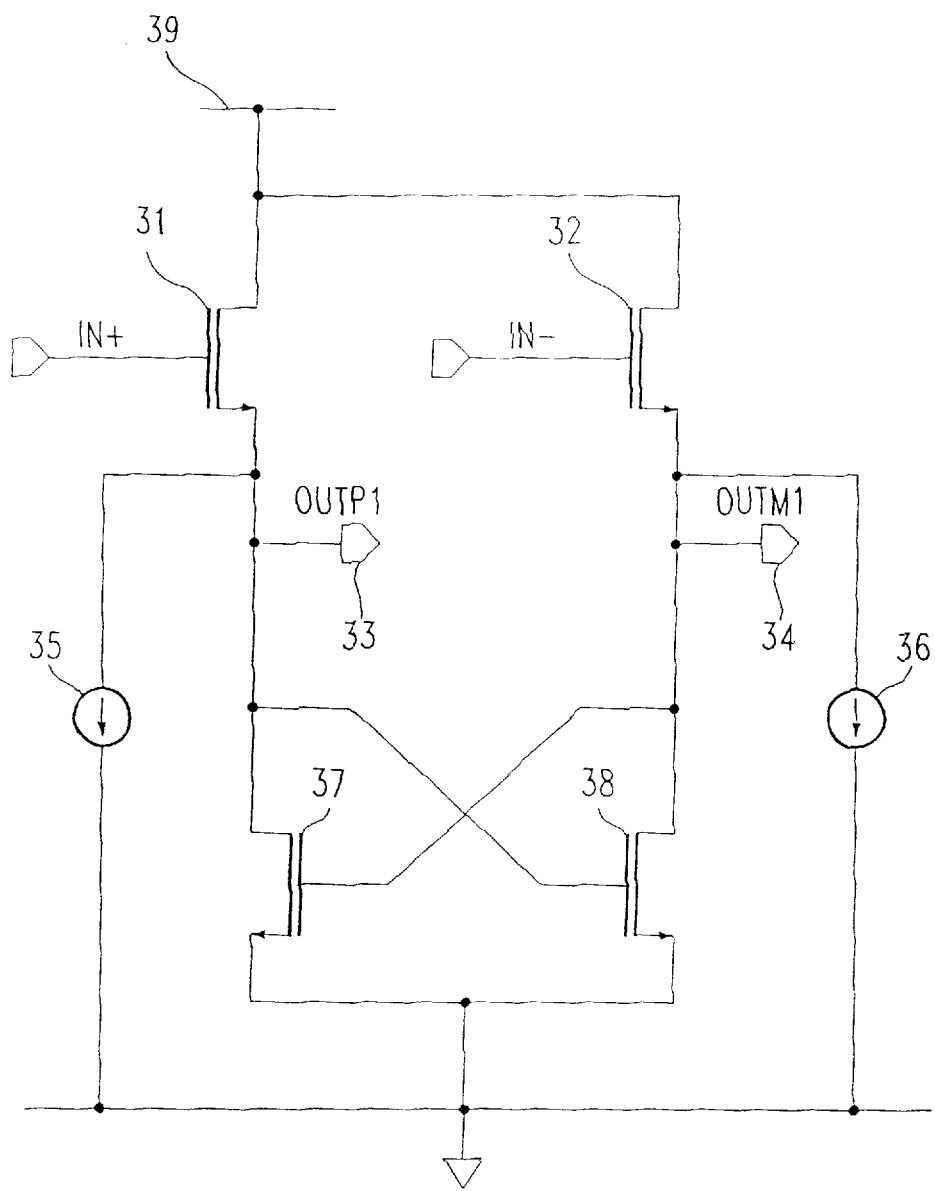
FIG. 3 illustrates the differential source follower of the present invention.

A circuit configuration that achieves the objects of the present invention is illustrated in FIG. 3. This circuit includes a pair of FET's 37, 38 with their drains connected to the outputs of the source followers 31, 32, their gates cross-coupled to their drains, and their sources grounded (instead of ground a negative voltage supply would also work well). Current sources 35, 36 are connected to the followers 31, 32 in parallel with the FET's 37, 38, respectively, while the source followers 31, 32 receive differential inputs IN+ and IN− and are coupled to a supply terminal 39. Precision differential output signals are provided at the sources 33, 34 of the followers 31, 32.

Figure 4:
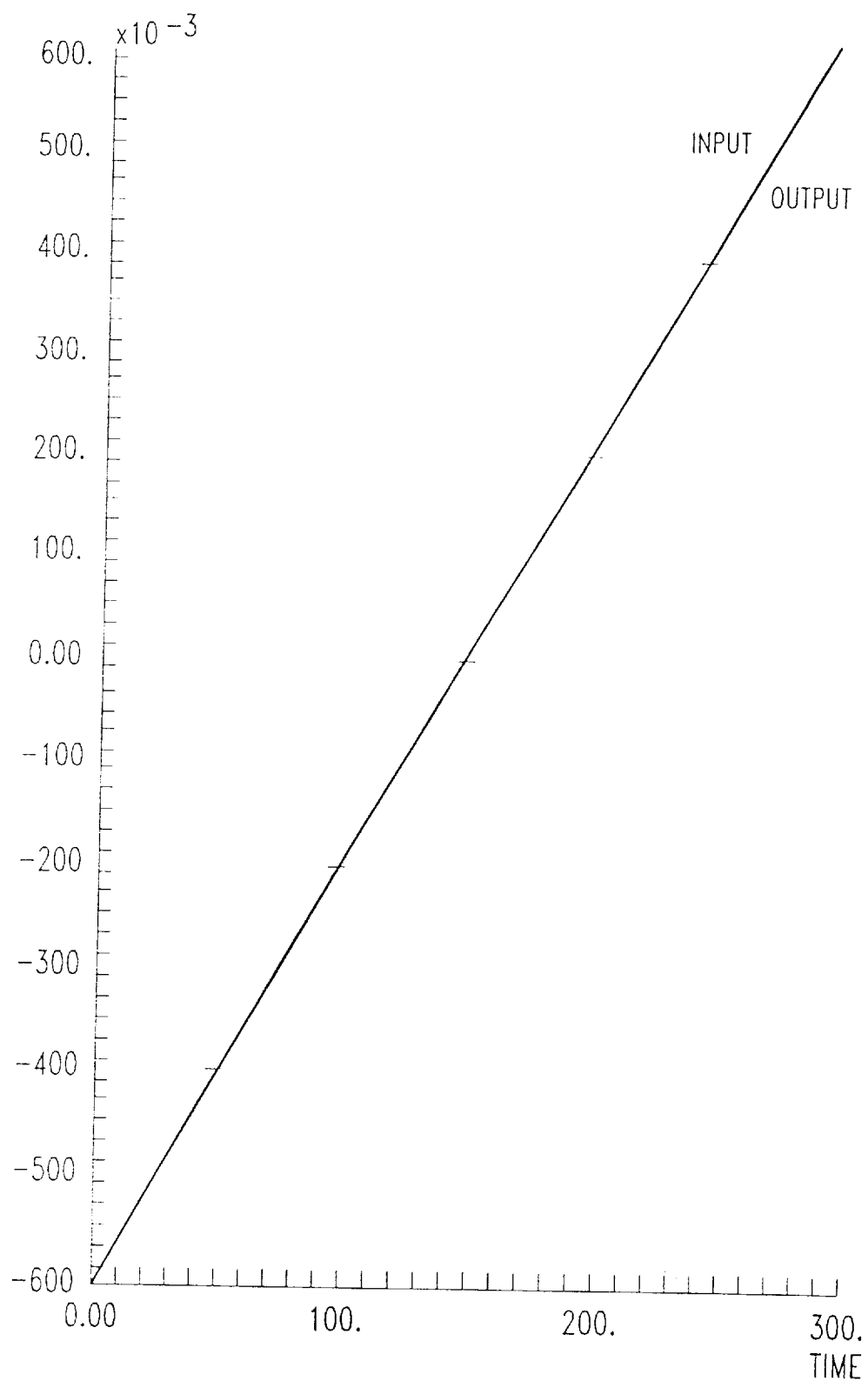
FIG. 4 illustrates the transfer function for the inventive differential source follower of FIG. 3 with a mismatch of essentially zero over the input signal level range.

This approach takes advantage of the fact that in a differential source follower, the signal at the opposing input changes in a way exactly opposite to that at the input under consideration. Hence, as the signal appearing at the source of one of the followers acts to increase that follower's $V_{GS}$ by increasing its threshold (or vice versa), the cross-coupled FET with its gate connected to the opposing output acts to decrease the follower's $V_{GS}$ by reducing its current (or increasing its current to counteract an excessive decrease in $V_{GS}$). By proper tuning of the sizes of the cross-coupled devices 37, 38, the attenuation in the source followers 31, 32 can be eliminated. The selection of the cross-coupled devices must be precisely fitted to the overall circuit to achieve this desired performance improvement, i.e., an accurate size of devices is necessary to exactly cancel out the body effect of a given circuit. A general range of sizes for these devices likely will not achieve the precise fit necessary. One method for selecting properly sized FETs includes iterative simulation using computer models with varying FET sizes until an optimum transfer function is realized. The transfer function of FIG. 4 illustrates the improved performance of a circuit with properly selected devices. The mismatch error is negligible (essentially zero) over the entire signal range which involves a magnitude of about ±600 mV.

Note that a mathematical solution to the sizing of the cross-coupled devices is extremely difficult to develop. It first requires an accurate model of the relationship between the threshold voltage and the source voltage. This appears to be largely a square-law relationship, which complicates the computation tremendously. Setting the sizes precisely and empirically using the device models seems to work quite well as evidenced by the hardware built taking advantage of this technique, and the results shown in FIG. 4.

ALTERNATIVE EMBODIMENTS

Figure 5:
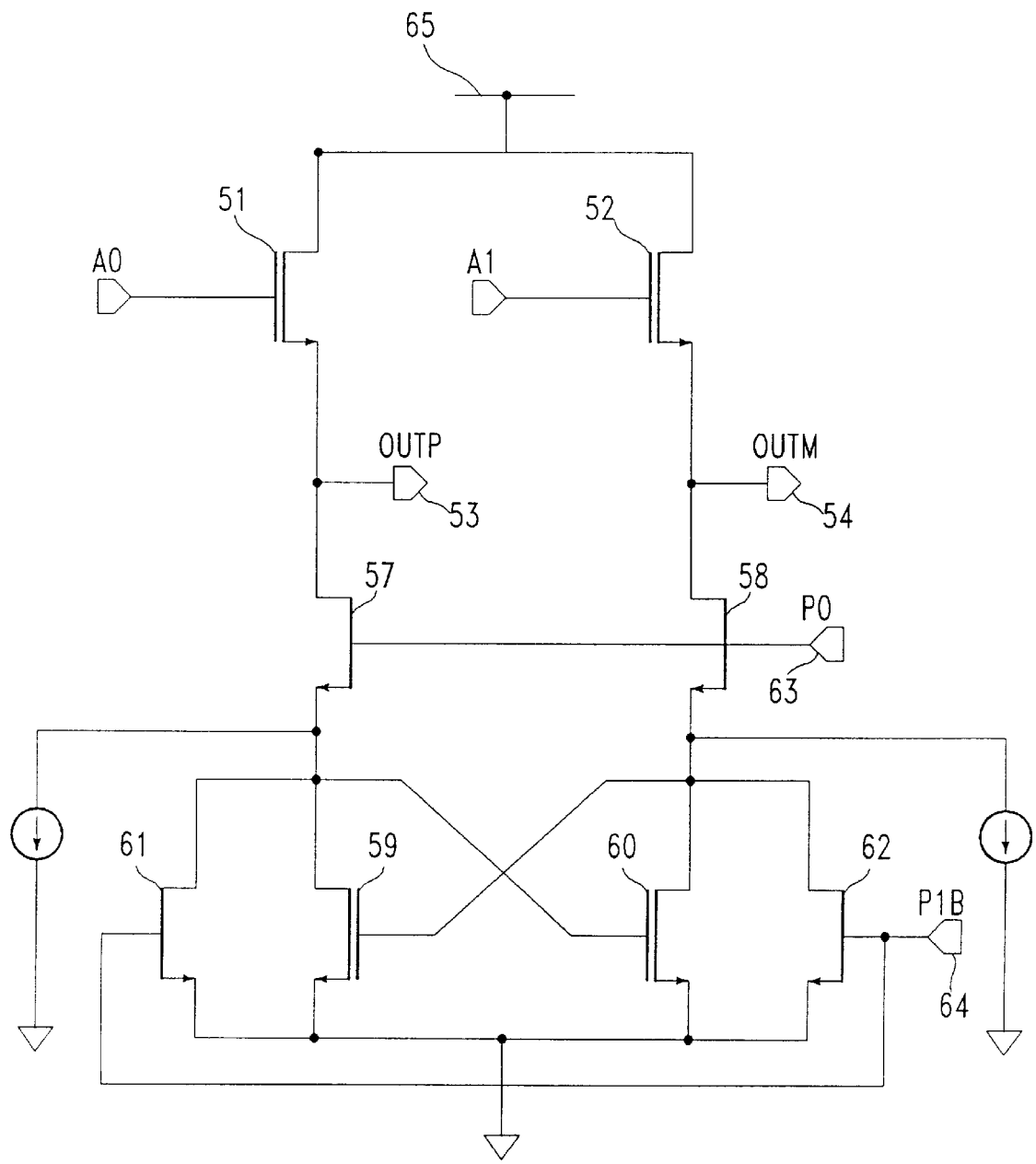
FIG. 5 illustrates the inventive differential source follower with power disable feature.

Referring to FIG. 5, a low (zero) power disable state was added to the circuit design of FIG. 3. In the power disable state, the DC bias currents can be turned off and the paths between the followers 51, 52 and the bias/cross coupled pair 59, 60 opened (or closed) by switching the newly added transistors 57, 58 via control input 63, and the outputs of the bias/cross-coupled pair 59, 60 are pulled to ground by switching the newly added transistors 61, 62 via control input 64. This circuit has the same functional characteristics of the circuit in FIG. 3 but does not draw any DC current when selectively disabled.

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. Apparatus comprising:
   a first and a second FET each receiving a differential input signal and both coupled to a first supply terminal;
   a third and a fourth FET, cross-coupled to the first and the second FET such that the first FET is coupled to the third FET and to a gate of the fourth FET and the second FET is coupled to the fourth FET and to a gate of the third FET;
   a first current source providing a substantially constant current coupled to the first FET in parallel with the third FET;
   a second current source providing a substantially constant current coupled to the second FET in parallel with the fourth FET; and
   a first and a second output coupled to the first and second FETs, respectively, for outputting unity gain signals having differential voltage substantially equivalent to the differential input signals.

2. The apparatus of claim 1, wherein a mismatch of the unity gain signals is less than about 1% throughout an input signal level range from at least about −600 mV to at least about 600 mV.

3. The apparatus of claim 1, wherein the first and second current sources and the third and fourth FETs are all also coupled to a second supply terminal.

4. A differential source follower circuit comprising:
   supply means for coupling the circuit to a power source;
   input means for receiving differential input signals;
   output means, coupled to the input means and to the supply means, for providing unity gain output signals having differential voltage substantially equivalent to the differential input signals; and
   correction means coupled to the input means for counteracting a source-body voltage fluctuation in the input means and for maintaining constant a Vgs voltage in the input means.

5. The circuit according to claim 4, wherein
   the output means comprises first and second FETs, each receiving one of the differential input signals, and
   the correction means comprises:
      third and fourth FETs cross-coupled to the first and second FETs; and
      first and second current sources coupled to, and for drawing bias currents through, the first and second FETs, respectively.

6. The circuit according to claim 5, wherein the third and fourth FETs and the first and second current sources are all coupled to a sink, and wherein sizes of the third and fourth FETS are preselected to modulate a corrective amount of the bias currents drawn by the first and second current sources, respectively, through the first and second FETs, respectively.

7. The circuit according to claim 4, wherein the correction means comprises:
   bias means for drawing current through the input means; and
   control means responsive to a voltage level of one of the unity gain output signals for modulating an amount of current the bias means draws through the input means, said amount of current counteracting the voltage fluctuation in the input means.

8. The circuit according to claim 7, wherein the bias means includes a current source, the input means includes a pair of FETs, and the control means includes a control FET, the control FET appropriately sized to effectuate the counteracting of the voltage fluctuation and responsive to a unity gain output signal associated with one of the pair of FETs for controlling an amount of current the current source draws through another of the pair of FETs.

9. A differential source follower circuit comprising:
   supply means for coupling the circuit to a power source;
   input means for receiving differential input signals;
   output means, coupled to the input means and to the supply means, for providing unity gain output signals in response to the differential input signals;
   correction means coupled to the input means for counteracting an inherent voltage fluctuation in the input means which attenuates the unity gain output signals; and wherein the correction means comprises a low power means for shutting off bias currents flowing through the output means.

10. The circuit according to claim 9, wherein the low power means comprises a pair of FETs coupled to the output means, the pair of FETs selectively turned off to shut off the bias currents flowing through the output means.

11. A differential source follower circuit comprising:

supply means for coupling the circuit to a power source;

input means for receiving differential input signals;

output means, coupled to the input means and to the supply means, for providing unity gain output signals in response to the differential input signals;

correction means coupled to the input means for counteracting an inherent voltage fluctuation in the input means which attenuates the unity gain output signals;

wherein the output means comprises first and second FETs, each receiving one of the differential input signals, and the correction means comprises:

third and fourth FETs, coupled in series to the first and second FETs, respectively, for turning off bias currents flowing through the first and second FETs in response to control signals applied to the third and fourth FETs;

fifth and sixth FETs cross-coupled to the third and fourth FETs for receiving modulation signals from the first and second FETs; and first and second current sources coupled to, and for drawing bias currents through, the first and second FETs, respectively, the bias currents modulated by the fifth and sixth FETs.

12. The circuit according to claim 11, wherein the correction means further comprises:

seventh and eighth FETs coupled to the third and fourth FETs for maintaining substantially zero volts across the first and second current sources and across drain-to-source in each of the fifth and sixth FETs in response to control signals applied to the seventh and eighth FETs.

13. A differential follower circuit comprising:

input/output means, coupled to a first voltage terminal, for receiving differential input signals and for providing unity gain output signals having differential voltage substantially equivalent to the differential input signals; and correction means, coupled to the input/output means and to a second voltage terminal, for compensating a source-body voltage fluctuation in the input/output means such that an output-to-input signal mismatch of the circuit is less than about 1% for differential input signal levels between about −600 mV and about +600 mV.

14. Apparatus comprising:

a first FET and a second FET, both coupled to a supply terminal, for receiving a differential input signal and for providing a differential output signal having differential voltage substantially equivalent to the differential input signal;

a third FET and a fourth FET, the third FET coupled to the first FET and the fourth FET coupled to the second FET;

a fifth FET and a sixth FET, cross-coupled to the third and the fourth FET, such that the third FET is coupled to the fifth FET and to a gate of the sixth FET and the fourth FET is coupled to the sixth FET and to a gate of the fifth FET;

a seventh FET and an eighth FET, the seventh FET coupled to the third FET in parallel with the fifth FET and the eighth FET coupled to the fourth FET in parallel with the sixth FET; and a pair of inputs for selectively turning off a bias current supplied to the first and second FETs, one of the inputs coupled to the third and fourth FETs and another of the inputs coupled to the seventh and eighth FETs.

15. A method of improving input-to-output mismatch in a differential source follower circuit comprising the steps of:

(a) providing a transistor-and-current source combination for each differential output of the circuit for modulating the source-body voltage fluctuation in a a source follower associated with said each differential output of the circuit and maintaining its Vgs substantially constant, including applying a modulation signal to a transistor in a first transistor-and-current source combination;

(b) providing a differential output associated with a first source follower to the transistor in the first transistor-and-current source combination as the modulation signal; and (c) counteracting said source-body voltage fluctuation in a second source follower and maintaining its Vgs substantially constant, including modulating an amount of current drawn by a current source in the first transistor-and-current source combination through the second source follower of the circuit in response to the modulation signal.

16. A method of providing a differential unity gain input buffer circuit producing an output signal differential voltage substantially equivalent to an input signal differential voltage, the method comprising the steps of:

(a) coupling a first differential output of the input buffer circuit to a bias current control circuit which is coupled to a second differential output of the input buffer circuit; and (b) modulating a drain current flowing through said second differential output with the bias current control circuit in response to output signals supplied by said first differential output.

* * * * *